US011073874B2

(12) United States Patent
Escamilla et al.

(10) Patent No.: US 11,073,874 B2
(45) Date of Patent: Jul. 27, 2021

(54) APPARATUS AND METHOD FOR CONTROLLED EJECTION OF AN OPEN COMPUTE PROJECT MODULE FROM AN INFORMATION HANDLING SYSTEM

(71) Applicant: DELL PRODUCTS, LP, Round Rock, TX (US)

(72) Inventors: Eduardo Escamilla, Round Rock, TX (US); Patrick Vincent Illingworth, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/507,554

(22) Filed: Jul. 10, 2019

(65) Prior Publication Data

US 2021/0011529 A1    Jan. 14, 2021

(51) Int. Cl.
*G06F 1/18*      (2006.01)
*H05K 5/02*    (2006.01)
*H04L 12/931*    (2013.01)
*H05K 7/14*    (2006.01)

(52) U.S. Cl.
CPC .............. *G06F 1/186* (2013.01); *H04L 49/40* (2013.01); *H05K 5/0221* (2013.01); *H05K 7/1489* (2013.01)

(58) Field of Classification Search
CPC ....... G06F 1/186; H04L 49/40; H05K 7/1489; H05K 5/0221
See application file for complete search history.

(56) References Cited

U.S. PATENT DOCUMENTS

| | | | |
|---|---|---|---|
| 6,347,715 B1 * | 2/2002 | Drozdenko | H01R 9/18 211/26 |
| 6,373,696 B1 * | 4/2002 | Bolognia | G06F 1/184 361/679.33 |
| 7,086,721 B2 | 8/2006 | Silverbrook et al. | |
| 7,400,499 B2 | 7/2008 | Mundt et al. | |
| 7,499,286 B2 * | 3/2009 | Berke | H05K 7/1487 361/727 |
| 8,060,682 B1 * | 11/2011 | Genetti | G06F 13/4022 370/400 |
| 8,475,214 B2 * | 7/2013 | Shtargot | H05K 7/1492 361/679.39 |
| 8,582,287 B2 * | 11/2013 | Nguyen | G11B 33/124 211/126.6 |
| 8,634,189 B2 | 1/2014 | Escamilla et al. | |
| 9,086,856 B2 * | 7/2015 | Tsao | G06F 1/181 |
| 9,103,399 B2 * | 8/2015 | Miyakoshi | G03G 21/1619 |
| 9,462,719 B2 * | 10/2016 | Wu | H05K 7/1409 |
| 9,603,280 B2 * | 3/2017 | Frank | H05K 7/20154 |
| 9,674,978 B2 * | 6/2017 | Wu | G06F 1/185 |
| 9,901,005 B2 * | 2/2018 | Okumura | H05K 5/0217 |

(Continued)

*Primary Examiner* — Adrian S Wilson
*Assistant Examiner* — Theron S Milliser
(74) *Attorney, Agent, or Firm* — Larson Newman, LLP

(57) ABSTRACT

An information handling system includes a peripheral interface and a frame that is operable to receive an Open Compute Project (OCP) module. The frame includes a peripheral slot that provides an electrical communication between the OCP module and the peripheral interface when the OCP module is disposed at a first position. A lock controls the ejection of the OCP module from the first position to a second position, and disengages from the OCP module at the second position.

20 Claims, 7 Drawing Sheets

(56) References Cited

U.S. PATENT DOCUMENTS

| | | | |
|---|---|---|---|
| 2002/0124114 A1* | 9/2002 | Bottom | H04L 49/351 709/251 |
| 2003/0033361 A1* | 2/2003 | Garnett | G06F 1/187 709/203 |
| 2005/0018397 A1* | 1/2005 | Kay | G06F 1/184 361/679.35 |
| 2005/0135910 A1 | 6/2005 | Pruteanu et al. | |
| 2007/0014085 A1* | 1/2007 | Meserth | G11B 33/12 361/679.35 |
| 2007/0205010 A1* | 9/2007 | Chen | G11B 33/12 174/50 |
| 2009/0273901 A1* | 11/2009 | Jaramillo | H05K 7/1492 361/679.58 |
| 2012/0182671 A1* | 7/2012 | Hou | H05K 7/1489 361/679.01 |
| 2013/0033814 A1* | 2/2013 | Huang | G06F 1/1626 361/679.37 |
| 2013/0048813 A1* | 2/2013 | Liu | G06F 1/187 248/222.11 |
| 2016/0073554 A1* | 3/2016 | Marcade | G06F 1/185 211/26 |
| 2017/0094822 A1* | 3/2017 | Chen | H05K 7/1489 |

\* cited by examiner

APPARATUS AND METHOD FOR CONTROLLED EJECTION OF AN OPEN COMPUTE PROJECT MODULE FROM AN INFORMATION HANDLING SYSTEM

FIELD OF THE DISCLOSURE

This disclosure generally relates to information handling systems, and more particularly relates to controlling ejection of an open compute project module from an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling includes a peripheral interface and a frame that is operable to receive an Open Compute Project (OCP) module. The frame may include a peripheral slot that provides an electrical communication between the OCP module and the peripheral interface when the OCP module is disposed at a first position. A lock controls the ejection of the OCP module from the first position to a second position, and disengages from the OCP module at the second position.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
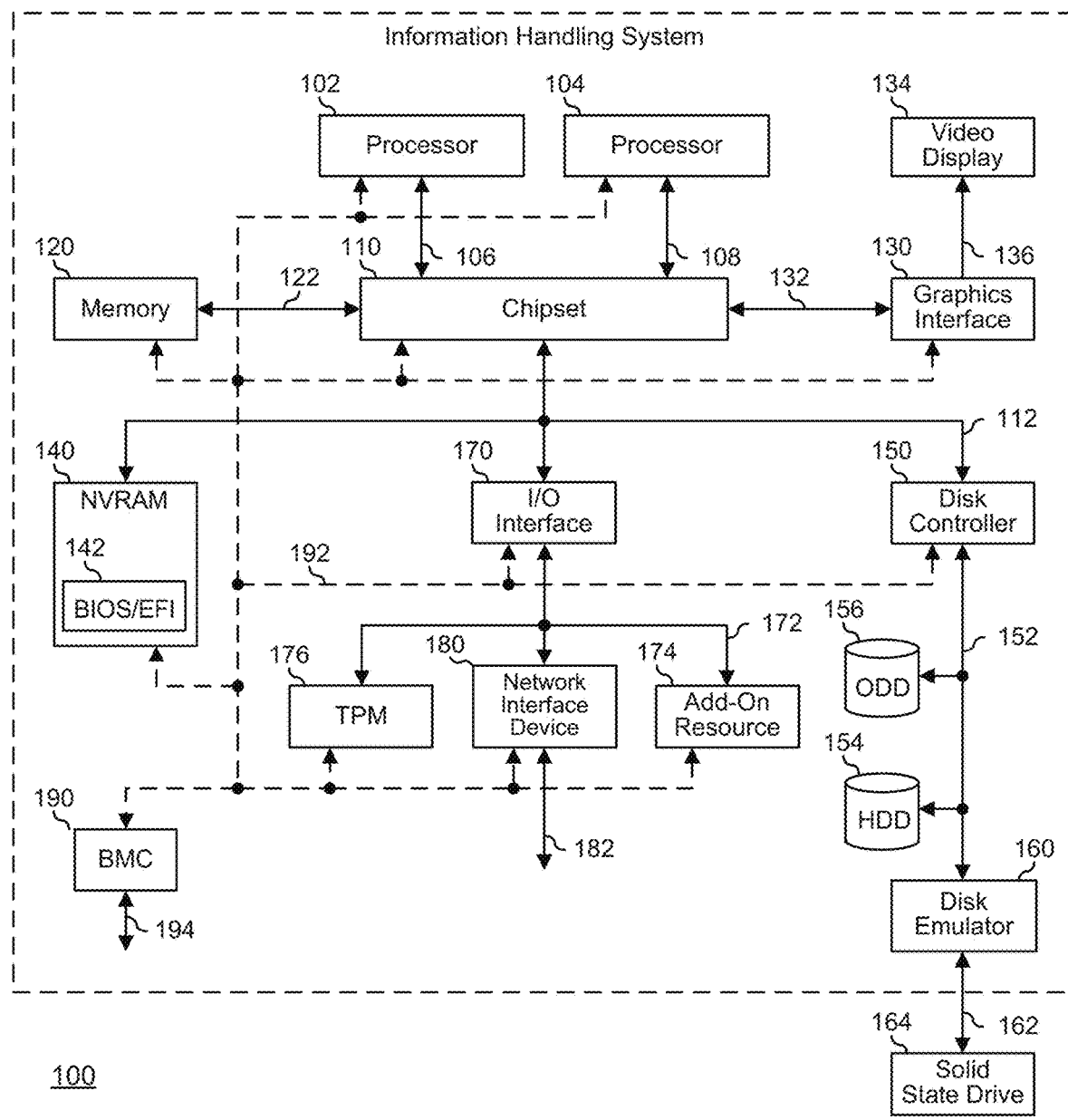
FIG. 1 is a block diagram of a generalized information handling system.

FIG. 1 illustrates an embodiment of an information handling system 100 including processors 102 and 104, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, a trusted platform module (TPM) 176, a network interface device 180, and a baseboard management controller (BMC) 190. Processor 102 is connected to chipset 110 via processor interface 106, and processor 104 is connected to chipset 110 via processor interface 108.

Chipset 110 represents an integrated circuit or group of integrated circuits that manages data flow between processors 102 and 104 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102 and 104. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 and 104 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnect-express interface (PCIe) and graphics adapter 130 can include a four lane (×4) PCIe adapter, an eight lane (×8) PCIe adapter, a 16-lane (×16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller 150 to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface device 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a sound card, data storage system, an additional graphics interface, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface device 180 translates information from a format suitable to the peripheral channel to a format suitable to external devices. In a particular embodiment, network interface device 180 includes a host bus adapter (HBA), a host channel adapter, a network interface card (NIC), or other hardware circuit that can connect the information handling system to a network. An example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from processors 102 and 104, which provides various management functions for information handling system 100. In an embodiment, BMC 190 may be responsible for granting access to a remote management system that may establish control of the elements to implement power management, cooling management, storage management, and the like. The BMC 190 may also grant access to an external device. In this case, the BMC may include transceiver circuitry to establish wireless communications with the external device such as a mobile device. The transceiver circuitry may operate on a Wi-Fi channel, a near-field communication (NFC) channel, a Bluetooth or Bluetooth-Low-Energy (BLE) channel, a cellular based interface such as a global system for mobile (GSM) interface, a code-division multiple access (CDMA) interface, a universal mobile telecommunications system (UMTS) interface, a long-term evolution (LTE) interface, another cellular based interface, or a combination thereof. A mobile device may include Ultrabook, a tablet computer, a netbook, a notebook computer, a laptop computer, mobile telephone, a cellular telephone, a smartphone, a personal digital assistant, a multimedia playback device, a digital music player, a digital video player, a navigational device, a digital camera, and the like.

The term BMC may be used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller, and embedded controllers included at the blades of the blade server can be referred to as blade management controllers. Out-of-band communication interfaces between BMC and elements of the information handling system may be provided by management interface 192 that may include an inter-integrated circuit (I2C) bus, a system management bus (SMBUS), a power management bus (PMBUS), a low pin count (LPC) interface, a serial bus such as a universal serial bus (USB) or a serial peripheral interface (SPI), a network interface such as an Ethernet interface, a high-speed serial data link such as PCIe interface, a network controller-sideband interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

In an embodiment, the BMC 190 implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as Web Services Management (WS-MAN) interface, a Management Component Transport Protocol (MCTP) or, Redfish interface), various vendor defined interfaces (such as Dell EMC Remote Access Controller Administrator (RACADM) utility, Dell EMC Open Manage Server Administrator (OMSS) utility, Dell EMC Open Manage Storage Services (OMSS) utility, Dell EMC Open Manage Deployment Toolkit (DTK) suite), representational state transfer (REST) web API, a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated into another element of the information handling system such as chipset 110, or another suitable element, as needed or desired. As such, BMC 190 can be part of an integrated circuit or a chip set within information handling system 100. BMC 190 may operate on a separate power plane from other resources in information handling system 100. Thus BMC 190 can communicate with the remote management system via network interface 194 or the BMC can communicate with the external mobile device using its own transceiver circuitry while the resources or elements of information handling system 100 are powered off or at least in low power mode. Here, information can be sent from the remote management system or external mobile device to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

In a typical usage case, information handling system 100 represents an enterprise class processing system, such as may be found in a datacenter or other compute-intense processing environment. Here, there may be hundreds or thousands of other enterprise class processing systems in the datacenter. In such an environment, the information handling system may represent one of a wide variety of different types of equipment that perform the main processing tasks of the datacenter, such as modular blade servers, switching and routing equipment (network routers, top-of-rack switches, and the like), data storage equipment (storage servers, network attached storage, storage area networks, and the like), or other computing equipment that the datacenter uses to perform the processing tasks.

Open Compute Project (OCP) is an organization that promotes efficient hardware designs for scalable computing. The OCP has proposed a server project that provides standardized system specifications. One of these specifications includes an OCP module having defined locations of notches along its outer perimeter. The OCP module may include a peripheral card such as the NIC that can be installed or removed from the information handling system. Further information may be found in OCP NIC 3.0 specification at www.opencompute.org/documents, which is incorporated herein by reference in its entirety. This particular hardware configuration can be improved by leveraging the defined locations of the notches in the OCP module as described below.

Figure 2:
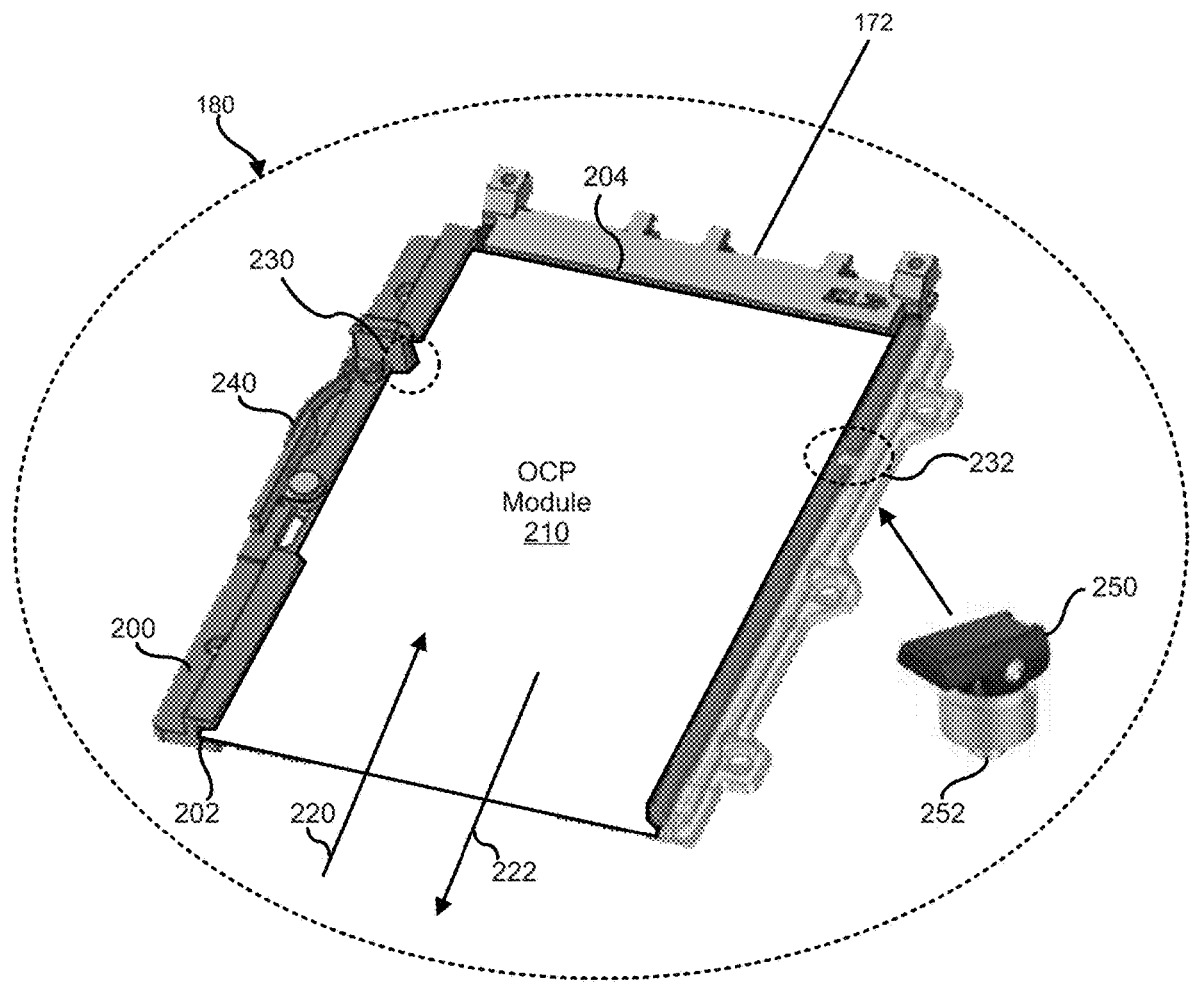
FIG. 2 is a perspective view of a network interface device including an open compute project (OCP) module that is disposed in a first position, according to an embodiment of the present disclosure.

FIG. 2 shows a perspective view of the network interface device 180 that can be mounted in the main circuit board of the server. The network interface device 180 includes a frame 200 having a channel 202 and a peripheral slot 204. The channel 202 is operable to receive an OCP module 210 while the peripheral slot 204 can provide electrical communication between the OCP module and the peripheral interface 172. The OCP module 210 may be installed into the channel 202 along direction 220, or removed from the channel along direction 222. The OCP module 210 may include a first notch 230 and a second notch 232 that are operable to couple with a first lock 240 and a second lock 250, respectively, of the frame 200. The first lock 240 including a swing arm 245 can be integrated in the frame 200 with the swing arm biased to the first notch 230. The second lock 250 may be attached to the frame 200 and disposed opposite to the location of the first lock 240. The second lock 250 includes a plunger latch 252 that can be biased to the second notch 232 when the OCP module 210 is fully seated at the frame 200. The plunger latch 252 can be disengaged from the second notch 232 when the fully seated OCP module 210 is about to be retracted from the frame 200. With the disengaged plunger latch 252, the swing arm 245 can be used to control retraction of the OCP module 210 without touching main circuit board components by drawing the swing arm towards the direction 222 with the engaged OCP module. The fully seated OCP module 210 includes a position where a front end of the OCP module is plugged to the peripheral slot 204 and in electrical communication with the peripheral interface 172. The fully seated OCP module 210 is referred to herein as the OCP module that is disposed at a first position in the frame 200.

The OCP module 210 may include peripheral cards such as the NIC or other types of network interface devices 180. The OCP module 210 may include a flat printed circuit board (PCB) that is operable to connect different hardware circuit components such as resistors, diodes, etc. in one PCB. The OCP module 210 can include a square shape, or a rectangular shape. The OCP module 210 may be plugged to the frame 200 by sliding the OCP module into the channel 202 until its front side is in physical communication with the peripheral slot 204. The channel 202 may include a narrow opening that is formed within an inner perimeter of frame sides. The frame sides can include a front end side where the peripheral slot 204 is located and two equal sides where the first lock 240 and the second lock 250 are respectively disposed. The channel 202 may include dimensions that are substantially similar to the dimensions of the OCP module 210. For example, a length, width and thickness dimensions of the OCP module PCB may include 115 mm, 75 mm, and 3 mm, respectively. In this example, the length, width and thickness dimensions of the channel 202 may include about 115 mm, 76 mm, and 3.5 mm, respectively. In this case, the width and the thickness of the channel 202 may include enough clearances to prevent frictions between the OCP module 210 and the channel during installation or retraction of the OCP module.

The channel 202 may include a footprint that can be similar to the footprint of the OCP module 210. For example and where the footprint of the OCP module 210 is a square shape, then the channel footprint can include a square shape to securely fit the square shaped OCP module. In this example, only three sides of the OCP module 210 may be securely fitted into the channel 202 because a fourth side, which is located at opposite side of the peripheral slot 204, can be connected to an input/output bracket that may be reached from outside of the information handling system. The input/output bracket may include a handle bar that supports installation and extraction of the OCP module PCB from the frame 200. In another example and where the footprint of the OCP module PCB is a rectangle, the channel footprint is shaped as a rectangle in order to fit the OCP module 210, and so on. In these examples, the OCP module 210 is in the first position when all three sides of the OCP module PCB are securely fitted into the respective sides of the channel 202. The illustrated network interface device 180 shows the OCP module 210 that is disposed at the first position in the frame 200.

The first notch 230 includes a small opening along an outer perimeter of the OCP module 210 and along the frame side where the first lock 240 is located in the frame. The small opening is operable to receive the swing arm 245 of the first lock 240. The swing arm 245 includes a component of the first lock 240 that can be biased towards the first notch 230. In this regard, the small opening of the first notch 230 may include dimensions that can fit with enough clearances the swing arm of the first lock 240. In an embodiment, a top portion of the swing arm 245 can be extended above the frame so that a user can use the swing arm as an intuitive leverage point of ejection. For example, the user may use an index finger by pressing the index finger against the extended top portion of the swing arm 245 that is biased to the first notch 230. In this example, the user may slide the swing arm 245 towards the direction 222 during OCP module retraction, or along the direction 220 during OCP module installation to the first position. In this example, the first lock 240 may be able to provide a controlled extraction from the first position, or a controlled insertion of the OCP module 210 to the first position. That is, a leverage point for the removal of the installed OCP module may be provided so that a user may avoid touching main circuit components during the process.

The second notch 232 includes another small opening along the outer perimeter of the OCP module 210 and along the frame side where the second lock 250 is located in the frame. The small opening of the second notch 232 can be positioned along an opposite side of the first notch 230. The second notch 232 may include the same dimensions as that of the first notch 230. The second notch 232 may be operable to receive the plunger latch 252 of the second lock 250. For example and when the OCP module 210 is at the first position in the frame 200, the plunger latch 252 may be biased towards the second notch 232. In this example, the second lock 250 may act as a stopper for the fully seated OCP module 210.

The first lock 240 includes a structure that may be attached or integrated into the frame 200. The first lock 240 may include the movable swing arm 245 that can engage the OCP module 210 through the first notch 230. With the engaged OCP module 210, the movement of the swing arm 245 along the direction 220 or 222 is in sync with movement of the OCP module. While the second lock 250 is used to lock in place the OCP module 210 that is disposed in the first position, the first lock 240 provides a controlled manner of ejecting the OCP module 210 without touching the main board circuit components. For example, the second lock 250 disengages from the second notch 232 of the OCP module 210 that is disposed at the first position. At this state, the second lock 250 is disengaged while the swing arm 245 of the first lock 240 is biased towards the first notch 230. In this example, the user can use the protruding top portion of the swing arm 245 to move the OCP module 210 from the first position to a second position along the direction 222. At the second position, the swing arm 245 can disengage from the first notch 230. With the disengaged swing arm 245, the OCP module 210 may be safely ejected from the frame 200 with assistance from the input/output bracket that may be reached from outside of the information handling system. After the ejection of the OCP module 210 from the frame 200, the swing arm 245 of the first lock 240 can move back towards the channel 202 and will be ready again to engage a reinserted OCP module. In an embodiment, the second position may include the location of the first notch 230 where the swing arm 245 can move laterally away from the first notch in order to disengage the OCP module 210.

When the OCP module 210 is reinstalled into the frame 200 in the direction 220, the protruding swing arm 245 of the first lock 240 engages the OCP module when the first notch 230 get aligned with the swing arm. At this point, the OCP module 210 is said to be disposed at the second position. The user may use his finger against the top portion of the swing arm 245 in order to guide the engaged OCP module 210 towards the direction 220 until the OCP module is fully seated and disposed again to the first position.

Figure 3:
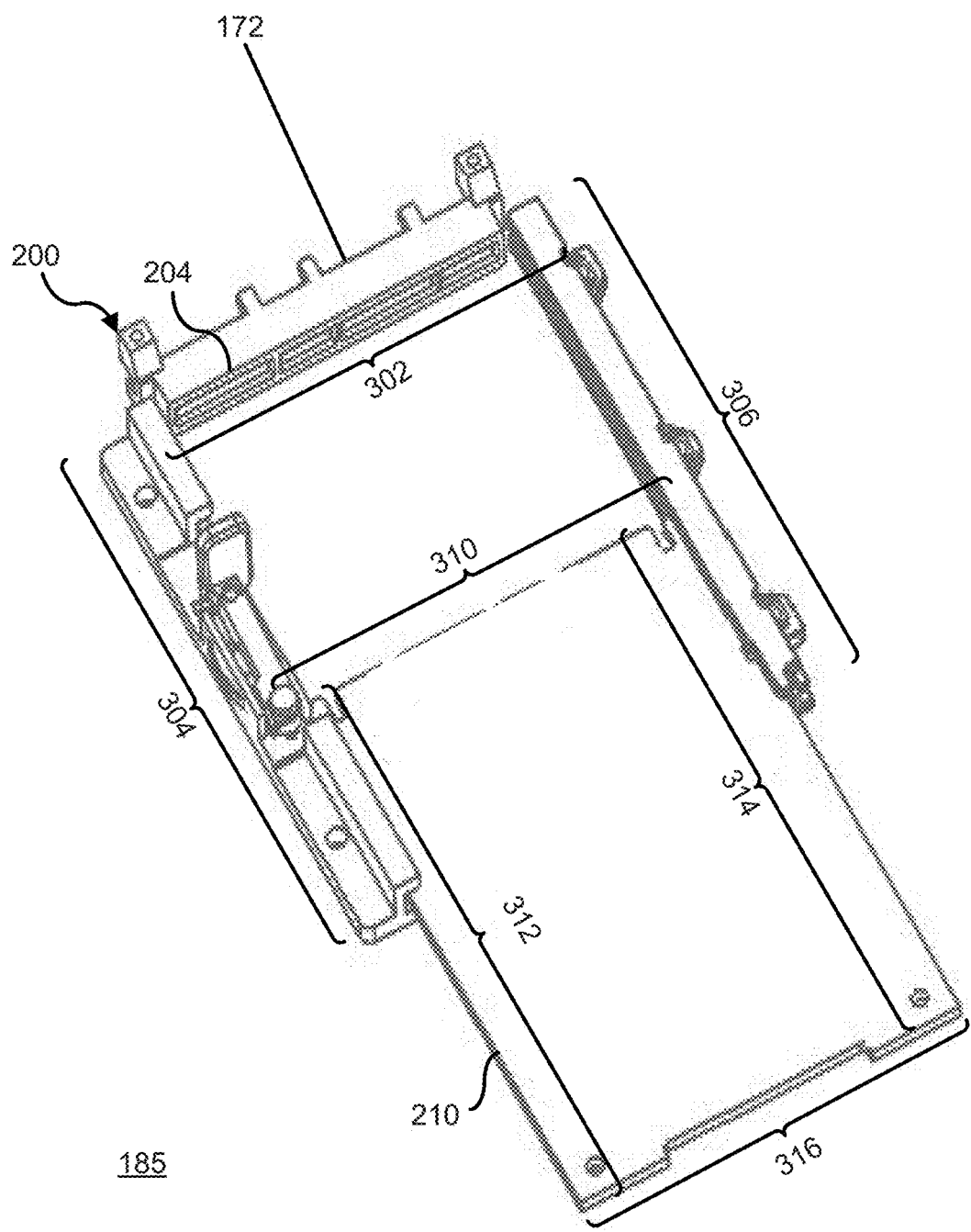
FIG. 3 is a perspective view of the network interface device including the OCP module that is retracted to a second position, according to an embodiment of the present disclosure.

FIG. 3 shows a perspective view of the network interface device 180 including the OCP module 210 that is disposed at the second position in the frame 200. The structure of the channel 202 may include a front end 302, a channel first side 304, and a channel second side 306. The structure of the OCP module 210 may include a front side 310 that can be plugged to the peripheral slot 204, a left side 312, a right side 314, and a back side 316. When the OCP module 210 is disposed in the first position, the channel front end 302, the first side 304, and the second side 306 may receive with enough clearances the front side 310, the left side 312, and the right side 314, respectively. In this first position, the plugged OCP module front end 310 is in electrical communication with the peripheral interface 172.

When the OCP module 210 is moved from the first position to the second position, the first notch 230 that is located along the left side 312 may disengage from the first lock 240. With the disengaged first lock 240, the OCP module 210 can be pulled by the input/output handle bar towards the direction 222. When the OCP module 210 is reinstalled into the frame 200, the first notch 230 may reengage the first lock 240 when the swing arm 245 is in alignment with the first notch. In this case, the user may use the swing arm 245 to assist the OCP module in getting to the first position. The components of the first lock 240 are further described below.

Figure 4:
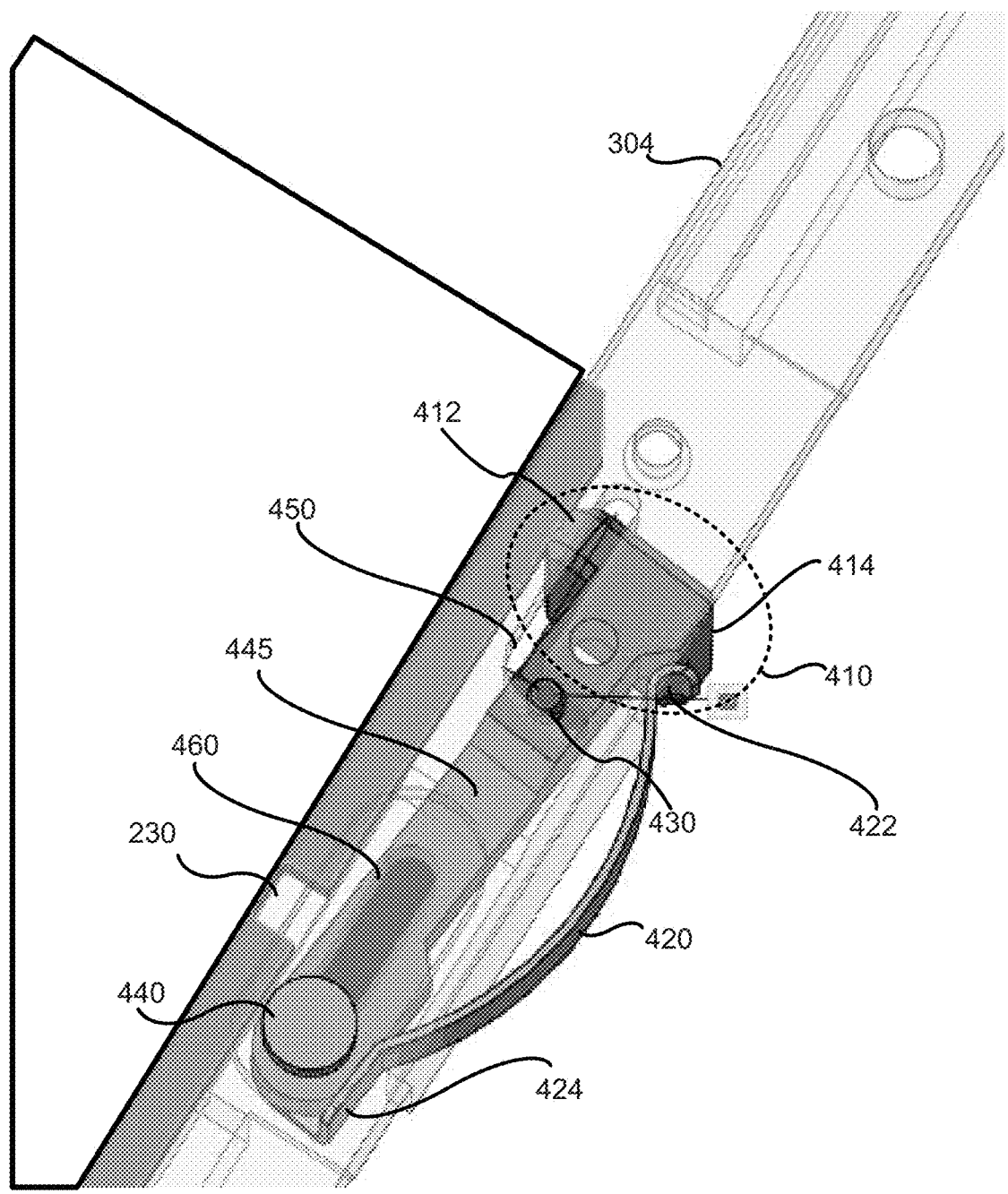
FIG. 4 is a perspective view of a portion of the network interface device including a first lock that provides a controlled ejection of the OCP module, according to an embodiment of the present disclosure.

FIG. 4 shows a portion 400 of the network interface device 180 including the first lock 240 that is disengaged from the first notch 230. The first lock 240 may include a swing arm 410 with a front end 412 and a back end 414, a spring 420 having a spring front end 422 and a spring back end 424, a first pivot pin 430, and a second pivot pin 440. The first pivot pin 430 and the second pivot pin 440 may be formed and disposed along a main shaft 445. Along the frame channel first side 304, a first guiding slot 450 and a second guiding slot 460 may be formed on the frame 200 to guide the first pivot pin 430 and the second pivot pin 440, respectively. For example, the first pivot pin 430 is formed along the side of the swing arm 410 while the second pivot pin is formed along the spring back end 424. In this example, movements of the pivot pins are limited by the shapes of their respective guiding slots. In this example still, the first pivot pin 430 and the second pivot pin 440 may travel synchronously along a particular path in their respective guiding slots. The swing arm 410 can be similar to the swing arm 245 that may be used as the leverage point for controlling movements of the OCP module 210 along the direction 220 or 222.

The swing arm 410 includes a portion at one end of the main shaft 445 having the front end 412 that is operable to engage the OCP module 210. The front end 412 may include a protruding shape having dimensions that are enough to latch into the opening of the first notch 230. For example, the dimensions of the first notch 230 include enough clearances to accommodate the mating front end 412 when the front end latches to the first notch 230. In this example, the shape of the front end 412 may be similar to the shape and of the first notch 230. In an embodiment, the back end 424 that is disposed at the opposite surface of the front end 412 may include a flat surface that protrudes from outer surface of the first side 304 of the frame 200. In this embodiment, the flat surface of the back end 424 can be used by the user to slide the OCP module 210 towards the direction 222 or 220. The flat surface of the back end 424 can also be attached or coupled to the spring front end 422. In this case, the back end 414 may receive a certain amount of axial force from the spring front end 422 in order to push the front end 412 towards the OCP module 210.

The spring 420 may include any kind of coil or mechanism that provides tensions to the swing arm 410. The spring 420 can provide enough amount of pressure to push the front end 412 towards the position of the OCP module 210. The amount of pressure that may be provided by the spring front end 422 is enough to bias the front end 412 towards the first notch 230. When the OCP module 210 is about to be extracted from the first position, the user may press axially the spring 420 towards the location of the OCM module and slide the spring dragging along the swing arm 410 towards the direction 222 until the second position is reached by the OCP module. At the second position, the user may pull with his finger the spring front end 412 so that it disengages from the first notch 230. In other embodiments, the spring 420 can be designed to pull the swing arm 410 away from the OCP module 210 when the OCP module is at the second position. In this other embodiment, the user may use his finger to push axially the swing arm 410 to engage the reinserted OCP module 210 at the second position. Once engaged, the user may press axially the spring 420 and then push the spring perpendicularly from direction of the axial stress and towards the direction 220. In other cases, the top portion of the swing arm 410 includes a surface that is extended above the frame 200. In this case, the user may use the top portion as the intuitive leverage point for ejecting the OCP module 210.

Each of the first pivot pin 430 and the second pivot pin 440 may include a short circular shaft that is disposed on each end of the main shaft 445. These short circular shafts are positioned to couple with the guiding slots. That is, these pivot pins are configured to fit into their respective guiding slots. The first guiding slot structure may be configured to include an "L" shape with bottom part of the "L" shape pointing outward from the position of the OCP module 210. The second guiding slot 460 may be configured to include an "I" shape that is disposed along a vertical line defined by longer side of the "L" shape of the first guiding slot 450. In an embodiment, the user may use protruding heads of the first pivot pin 430 or the second pivot pin 440 in order move the OCP module 210 from the first position to the second position, or vice-versa. In this embodiment, the first and second pivot pins move in sync when traveling in their respective guiding slots as further described below.

Figure 5:
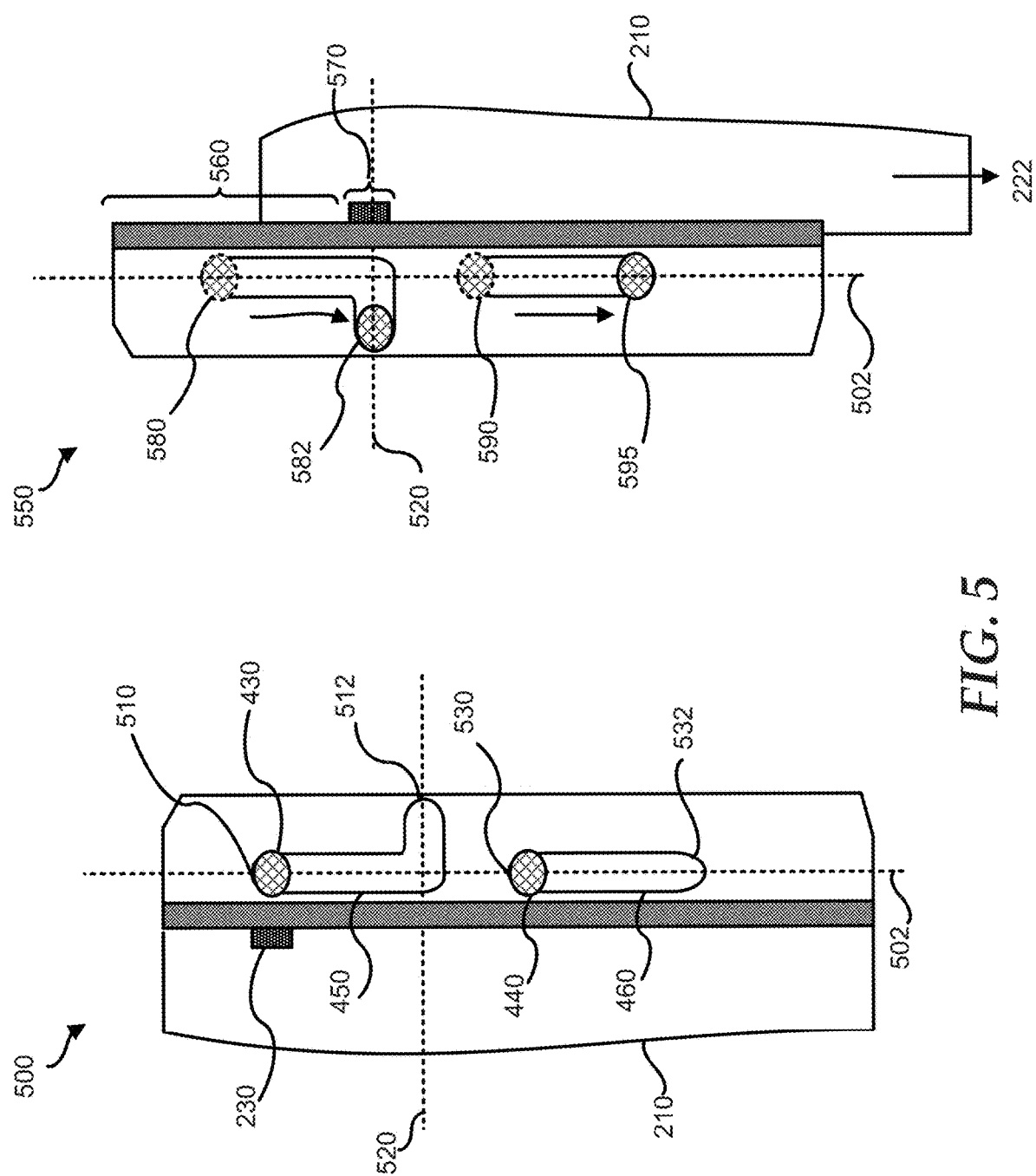
FIG. 5 is an illustration that shows an operation of the first lock when the OCP module is retracted from the first position to the second position, according to an embodiment of the present disclosure.

FIG. 5 shows synchronized movements of the first pivot pin 430 and the second pivot pin 440 when the OCP module 210 is moved from the first position to the second position. Rear view 500 shows a bottom portion of the network interface device 180 when the OCP module 210 is disposed at the first position, while a top view 550 shows a surface portion of the network interface device when the OCP module is retracted to the second position.

For the rear view 500, the first guiding slot 450 and the second guiding slot 460 may include an "L" shaped guiding slot and an "I" shaped guiding slot, respectively. The longer side of the "L" shaped first guiding slot 450 can be aligned with the "I" shaped second guiding slot 460 along a vertical axis 502. The "L" shaped first guiding slot 450 further includes a top end 510 and a bottom end 512. The bottom end 512 includes a tip of the shorter side of the "L" shape where the shorter side is aligned along a horizontal axis 520. That is, the tip of the shorter side is located at the opposite end of the top end 510. The "I" shaped guiding slot includes a top side 530 and a bottom side 532 where the length of the "I" shape lies along the vertical axis 502. For the fully seated OCP module, the first pivot pin 430 can be positioned at the top end 510 of the "L" shaped first guiding slot 450 while the second pivot pin 440 may be disposed at the top side 530 of the "I" shaped second guiding slot 460. In this first position, the front side 310 is plugged to the channel front end 302.

When the OCP module 210 is retracted from the first position as shown by the top view 550, the first pivot pin 430 and the second pivot pin 440 travels in sync and downward towards the OCP module direction 222. In this case, the swing arm front end 412 is biased to the OCP module 210 along a first distance 560. The first distance 560 includes the locations points of the first pivot pin 430 when the front end 412 is biased against the first notch 230. The location points include the first position where the first pivot pin 430 is disposed at the top end 510 of the first guiding slot 450. When the OCP module 210 reaches a second position 570, the first pivot pin 430 moves away from the OCP module 210 and travels along the horizontal axis 520 towards the location of the bottom end 512. The movement of the first pivot pin 430 from its initial location 580 to the disengagement location 582 is in sync with the movements of the swing arm front end 412. Thus, when the first pivot pin 430 is positioned at the bottom end 512 of the "L" shaped first guiding slot 450, the front end 412 travels laterally outward towards the direction of the bottom end 512 and accordingly disengages from the first notch 230. In an embodiment, the lateral distance travelled by the first pivot pin 430 along the horizontal axis 520 is at least equal to the depth of the first notch 230 so that the front end 412 can freely disengage from the OCP module 210 at the second position 570.

The second pivot pin 440 may be configured to move up and down the "I" shaped second guiding slot 460 and this movement is in sync with the movements of the first pivot pin 430. For example, when the first pivot pin 430 travels from its initial location 580 to the second position 570, the second pivot pin 440 also travels from its initial second pivot pin location 590 to final second pivot pin location 595. In this example, the final location of the second pivot pin 440 corresponds to the position of the first pivot pin 430 when the front end 412 is latched away from the first notch 230.

In other embodiments, the pivot pins are integrated or attached to the frame 200 while the first and second guiding slots are formed in the first lock. In this other embodiment, the front end 412 is disengaged from the first notch 230 when the bottom end 512 of the first guiding slot 450 reaches and is aligned to the position of the first pivot pin 430.

Figure 6:
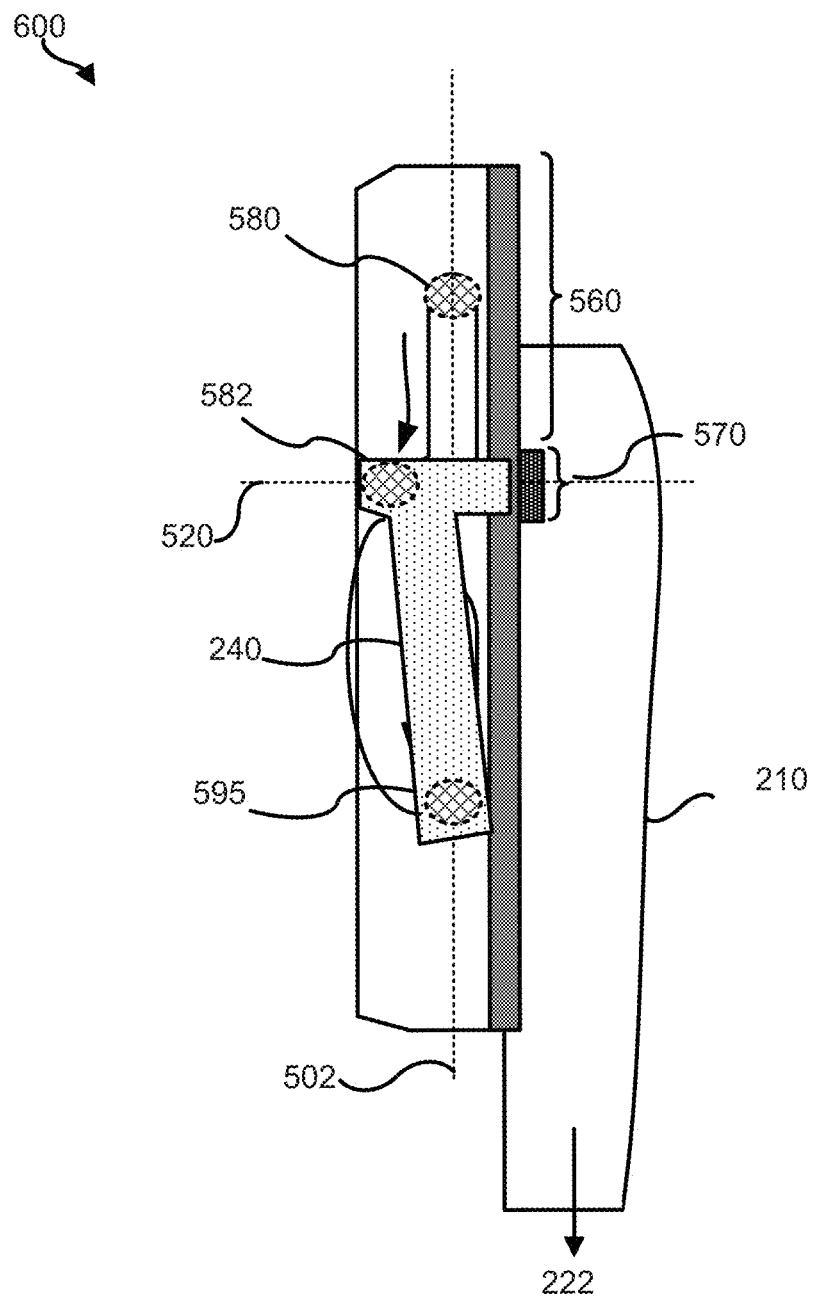
FIG. 6 is a top view of a portion of the network interface device including a swing arm that moves laterally away from the OCP module at the second position, according to an embodiment of the present disclosure.

FIG. 6 shows a portion 600 of the network interface device 180 where the swing arm 410 is disengaged from the first notch 230 at the second position 570. In an embodiment, the front end 412 engages the downward traveling OCP module 210 along the first distance 560. However and upon reaching the second position 570, the first pivot pin 430 moves away from the OCP module 210 and travels along the horizontal axis 520 towards the location of the bottom end 512. In this embodiment, the lateral distance travelled by the first pivot pin 430 along the horizontal axis 520 is at least equal to the depth of the first notch 230 so that the front end 412 can freely disengage from the OCP module 210. For example, when the first pivot pin 430 is located at the second position 570, the swing arm 410 moves laterally away from the position of the OCP module 210. In this example, the distance travelled by the swing arm 410 is at least equal to the depth of the first notch 230.

Figure 7:
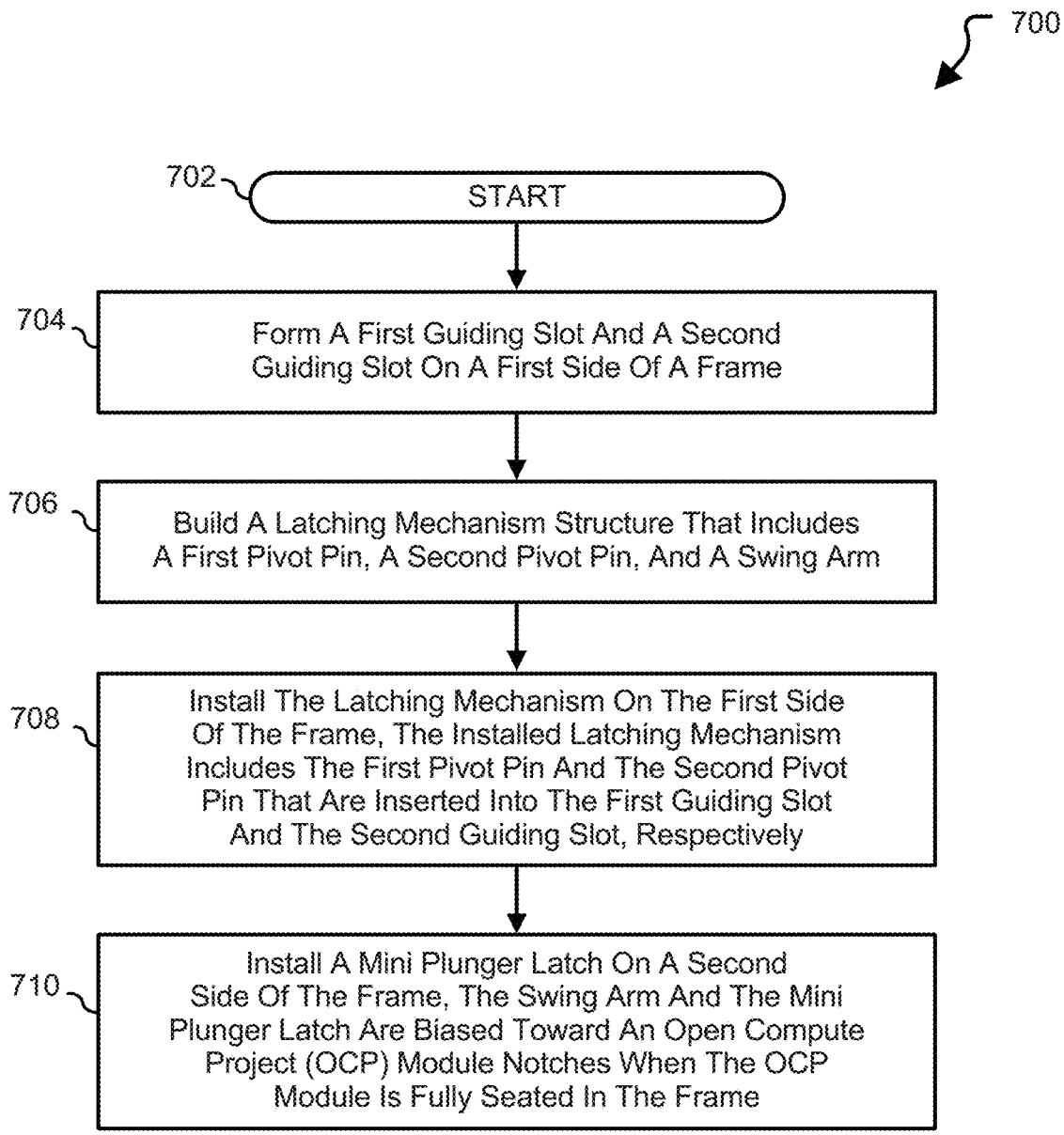
FIG. 7 is a flow chart showing a method for controlling an ejection of the OCP module from the first position to the second position, according to an embodiment of the present disclosure.

FIG. 7 shows a method for OCP module ejection assist from the first position to the second position, starting at block 702. At block 704, disengage a second lock from an OCP module that is disposed at a first position in the frame. For example and when the OCP module 210 is in the first position, the plunger latch 252 of the second lock 250 is disengaged from the second notch 232. At block 706, using a first lock to retract the OCP module from the first position to a second position. For example, the first lock 240 is disposed at the frame 200 so that its swing arm 410 may engage the first notch 230 when the OCP module 210 at the first position. In this example, the user may use protruding top portion of the swing arm 245 to retract the OCP module 210 from the first position to the second position. In other cases, the user may use the protruding head of the first pivot pin or the second pivot pin, or the spring 420 to move the OCP module 210 from the first position to the second position. At block 708, disengaging the swing arm front end at the second position is performed. At block 710, using an input/output bracket that may be reached from outside of the information handling system to eject the OCP module from the second position.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system with improved ejection of an electronic device module, comprising:
   a peripheral interface; and
   a frame that is operable to receive the electronic device module, the electronic device module including a plurality of notches along a perimeter of the electronic device module, the plurality of notches including first and second notches, the frame including:
      a peripheral slot along a first edge of the frame, the peripheral slot provides an electrical communication between the electronic device module and the peripheral interface when the electronic device module is disposed at a first position;
      a second edge extending substantially perpendicularly from a first end of the first edge, the second edge including a first channel to receive a first edge of the electronic device module;
      a third edge extending substantially perpendicularly from a second end of the first edge, the third edge including a second channel to receive a second edge of the electronic device module; and
      a lock including a swing arm with a front end, the front end of the swing arm mating with the first notch to secure the electronic device module in the first location, the lock controlling the ejection of the electronic device module from the first position to a second position, wherein the lock disengages from the first notch of the electronic device module at the second position.

2. The information handling system of claim 1, wherein the electronic device module includes a network interface card.

3. The information handling system of claim 1, wherein the electronic device module is disposed at the first position when the electronic device module is in physical communication with the peripheral slot.

4. The information handling system of claim 1, wherein the electronic device module is unplugged from the peripheral slot when the electronic device module moves from the first position to the second position.

5. The information handling system of claim 1, wherein the lock includes a first pivot pin and a second pivot pin that travel along a first guiding slot and a second guiding slot, respectively.

6. The information handling system of claim 5, wherein the first guiding slot includes an "L" shaped guiding slot while the second guiding slot includes an "I" shaped guiding slot.

7. The information handling system of claim 6, wherein the lock disengages from the electronic device module when the first pivot pin is located at a bottom end of the "L" shaped guiding slot.

8. The information handling system of claim 6, wherein the electronic device module is disposed in the first position when the second pivot pin is located at a top side of the "I" shaped guiding slot.

9. The information handling system of claim 1, wherein the swing arm engages the first notch of the electronic device module from the first position to the second position.

10. The information handling system of claim 9, wherein the swing arm moves out laterally from the electronic device module when the electronic device module is located at the second position.

11. A network interface device, comprising:
an electronic device module, the electronic device module including a plurality of notches along a perimeter of the electronic device module, the plurality of notches including first and second notches; and
a frame that is operable to receive the electronic device module, the frame including:
a first edge including a first channel to receive a first edge of the electronic device module;
a second edge including a second channel to receive a second edge of the electronic device module, wherein the first and second edges of the electronic device module are opposite edges of the electronic device module;
a peripheral slot that provides an electrical communication to the electronic device module when the electronic device module is disposed at a first position; and
a lock including a swing arm with a front end, the front end of the swing arm mating with the first notch to secure the electronic device module in the first location, the lock controlling an ejection of the electronic device module from the first position to a second position, wherein the lock disengages from the first notch of the electronic device module at the second position.

12. The network interface device of claim 11, wherein the electronic device module includes a network interface card.

13. The network interface device of claim 11, wherein the electronic device module is fully seated in the frame channel at the first position.

14. The network interface device of claim 11, wherein the electronic device module is unplugged from the peripheral slot when the electronic device module moves from the first position to the second position.

15. The network interface device of claim 11, wherein the lock includes a first pivot pin and a second pivot pin that travel along a first guiding slot and a second guiding slot, respectively.

16. The network interface device of claim 15, wherein the first guiding slot includes an "L" shaped guiding slot while the second guiding slot includes an "I" shaped guiding slot.

17. The network interface device of claim 16, wherein the lock disengages from the electronic device module when the first pivot pin is located at a bottom end of the "L" shaped guiding slot.

18. An information handling system, comprising:
a processor; and
a network interface device coupled to the processor, the network interface device including:
an electronic device module, the electronic device module including a plurality of notches along a perimeter of the electronic device module, the plurality of notches including first and second notches; and
a frame that is operable to receive the electronic device module, the frame including:
a peripheral slot along a first edge of the frame, the peripheral slot provides an electrical communication between the electronic device module and the processor when the electronic device module is disposed at a first position;
a second edge extending substantially perpendicularly from a first end of the first edge, the second edge including a first channel to receive a first edge of the electronic device module;
a third edge extending substantially perpendicularly from a second end of the first edge, the third edge including a second channel to receive a second edge of the electronic device module; and
a lock including a swing arm with a front end that mates with the first notch to secure the electronic device module in the first location, the lock controls an ejection of the electronic device module from the first position to a second position, wherein the lock disengages from the first notch of the electronic device module at the second position.

19. The information handling system of claim 18, wherein the electronic device module includes a network interface card.

20. The information handling system of claim 18, wherein the electronic device module is fully seated in the frame at the first position.

* * * * *